United States Patent
Huang

(10) Patent No.: US 10,164,536 B2
(45) Date of Patent: Dec. 25, 2018

(54) VOLTAGE CONVERSION CIRCUIT AND METHOD, AND MULTIPHASE PARALLEL POWER SYSTEM

(71) Applicant: Huawei Technologies Co., Ltd., Shenzhen (CN)

(72) Inventor: Chen Huang, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/902,782

(22) Filed: Feb. 22, 2018

(65) Prior Publication Data

US 2018/0183337 A1  Jun. 28, 2018

Related U.S. Application Data

(63) Continuation of application No. PCT/CN2016/095950, filed on Aug. 19, 2016.

(30) Foreign Application Priority Data

Aug. 25, 2015 (CN) ........................ 2015 1 0524521

(51) Int. Cl.
*H02M 3/158* (2006.01)
*H03K 4/06* (2006.01)
(Continued)

(52) U.S. Cl.
CPC ........... *H02M 3/1584* (2013.01); *H02M 1/08* (2013.01); *H02M 3/1582* (2013.01); *H03K 4/06* (2013.01);
(Continued)

(58) Field of Classification Search
CPC . H02M 2001/0003; H02M 2001/0025; H02M 2003/1586; H02M 3/1584; H02M 3/1582; H02M 1/08
See application file for complete search history.

(56) References Cited

U.S. PATENT DOCUMENTS

2004/0217741 A1  11/2004  Muratov et al.
2008/0266918 A1  10/2008  Vilain et al.
(Continued)

FOREIGN PATENT DOCUMENTS

CN  101350556 A  1/2009
CN  101375492 A  2/2009
(Continued)

OTHER PUBLICATIONS

Cortes, J., et al., "Comparison of the behavior of Voltage Mode, V2 and V2Ic control of a buck converter for a very fast and robust dynamic response," XP032591016, IEEE Applied Power Electronics Conference and Exposition, Mar. 16, 2014, pp. 2888-2894.
(Continued)

*Primary Examiner* — Timothy J Dole
*Assistant Examiner* — Ishrat Jamali
(74) *Attorney, Agent, or Firm* — Conley Rose, P.C.

(57) ABSTRACT

A voltage conversion circuit and method, and a multiphase parallel power system, where in the voltage conversion circuit, a feedback circuit provides a frequency-controllable feedback ripple signal. Therefore, the voltage conversion circuit has a controllable operating frequency, and a frequency requirement of a load may be met. Compensation does not need to be performed in a hysteresis mode, and therefore the hysteresis mode has a fast-speed response. The operating frequency is fixed. Therefore, the voltage conversion circuit in the embodiments may be applied to the multiphase parallel power system such that the multiphase parallel power system is applicable to an application scenario with a large load current.

16 Claims, 6 Drawing Sheets

(51) Int. Cl.
*H03K 5/04* (2006.01)
*H03K 7/08* (2006.01)
*H02M 1/08* (2006.01)
*H02M 1/00* (2006.01)

(52) U.S. Cl.
CPC ................. *H03K 5/04* (2013.01); *H03K 7/08* (2013.01); *H02M 2001/0003* (2013.01); *H02M 2001/0025* (2013.01); *H02M 2003/1586* (2013.01)

(56) References Cited

U.S. PATENT DOCUMENTS

| | | | |
|---|---|---|---|
| 2009/0009148 | A1 | 1/2009 | Philbrick et al. |
| 2010/0002477 | A1 | 1/2010 | Hasegawa et al. |
| 2011/0241636 | A1 | 10/2011 | Wu et al. |
| 2011/0291626 | A1* | 12/2011 | Murakami ............ H02M 3/156 323/271 |
| 2013/0051107 | A1 | 2/2013 | Rettig et al. |
| 2014/0002038 | A1* | 1/2014 | Hsu ..................... H02M 3/1584 323/271 |
| 2014/0159689 | A1* | 6/2014 | Chen .................... H02M 3/156 323/282 |
| 2014/0292300 | A1* | 10/2014 | Yan ...................... H02M 3/157 323/288 |
| 2015/0069986 | A1 | 3/2015 | Yanagida |
| 2015/0137776 | A1* | 5/2015 | Thomas .............. H02M 3/1588 323/271 |
| 2015/0155784 | A1 | 6/2015 | Ouyang et al. |

FOREIGN PATENT DOCUMENTS

| | | |
|---|---|---|
| CN | 101589540 A | 11/2009 |
| CN | 102290986 A | 12/2011 |
| CN | 102656788 A | 9/2012 |
| CN | 103023326 A | 4/2013 |
| CN | 103683935 A | 3/2014 |
| CN | 105048808 A | 11/2015 |
| JP | 2004040854 A | 2/2004 |
| JP | 2004328996 A | 11/2004 |
| TW | I454037 B | 9/2014 |
| TW | I511436 B | 12/2015 |
| TW | I521846 B | 2/2016 |

OTHER PUBLICATIONS

Cortes, J., et al., "V1 Concept: Designing a Voltage-Mode Control as Current Mode With Near Time-Optimal Response far Buck-Type Converters," XP011582417, IEEE Transactions on Power Electronics, vol. 30, No. 10, Nov. 7, 2014, pp. 5829-5841.

On Semiconductor, "1.5 A, 260 kHz and 520 kHz, Low Voltage Buck Regulators with External Bias or Synchronisation Capability," XP055490775, May 31, 2013, 20 pages.

Solley, D., "Theory of operation of V2 controllers with Emphasis on Applications using MLCC's for Output Filtering," XP055490881, May 31, 2009, 8 pages.

Foreign Communication From A Counterpart Application, European Application No. 16838528.4, Extended European Search Report dated Jul. 19, 2018, 13 pages.

Machine Translation and Abstract of Chinese Publication No. CN105048808, Nov. 11, 2015, 33 pages.

Machine Translation and Abstract of Japanese Publication No. JP2004040854, Feb. 5, 2004, 12 pages.

Foreign Communication From A Counterpart Application, Taiwanese Application No. 10620123160, Taiwanese Notice of Allowance dated Feb. 6, 2017, 2 pages.

Foreign Communication From A Counterpart Application, Taiwanese Application No. 10620123160, Taiwanese Search Report dated Jan. 17, 2017, 1 page.

Foreign Communication From A Counterpart Application, Chinese Application No. 201510524521.1, Chinese Office Action dated Feb. 27, 2017, 10 pages.

Foreign Communication From A Counterpart Application, PCT Application No. PCT/CN2016/095950, English Translation of International Search Report dated Nov. 25, 2016, 2 pages.

Foreign Communication From A Counterpart Application, PCT Application No. PCT/CN2016/095950, English Translation of International Search Report dated Nov. 25, 2016, 7 pages.

* cited by examiner

VOLTAGE CONVERSION CIRCUIT AND METHOD, AND MULTIPHASE PARALLEL POWER SYSTEM

CROSS-REFERENCE TO RELATED APPLICATIONS

This application is a continuation of International Patent Application No. PCT/CN2016/095950 filed on Aug. 19, 2016, which claims priority to Chinese Patent Application No. 201510524521.1 filed on Aug. 25, 2015. The disclosures of the aforementioned applications are hereby incorporated by reference in their entireties.

TECHNICAL FIELD

Embodiments of the present disclosure relate to electronic technologies, and in particular, relate to a voltage conversion circuit and method, and a multiphase parallel power system.

BACKGROUND

A Direct Current-Direct Current (DC-DC) converter is a circuit topology using which an input direct current voltage is converted into an output direct current voltage. According to a buck-boost characteristic of a system, the DC-DC converter may fall into several main types, such as a boost type, a buck type, and a buck-boost type. Generally, a low-power DC-DC converter uses a buck structure and a boost structure. Compared with a conventional linear power system, a buck DC-DC converter has higher conversion efficiency and saves more energy. The efficiency may be at least 80%. The buck DC-DC converter is widely used in various products of a mobile base station and a consumer terminal.

In an existing relatively mature DC-DC converter, modulation modes such as pulse-width modulation (PWM) and pulse-frequency modulation (PFM) are generally used such that the DC-DC converter can maintain stable performance in different operating conditions. The PWM modulation mode of the DC-DC converter further falls into a voltage-mode control manner, a current-mode control manner, and a hysteresis-mode control manner. A current-mode controlled DC-DC converter may have a fixed frequency and is suitable for multiphase parallel connection. However, the current-mode controlled DC-DC converter has a complex structure, a poor antinoise capability, and a poor load transient response. A voltage-mode controlled DC-DC converter may also have a fixed frequency. However, the voltage-mode controlled DC-DC is not suitable for multiphase parallel connection, has a complex internal compensation circuit, and wastes more areas. A hysteresis-mode controlled DC-DC converter has a simple structure, and a fast-speed load transient response. However, it is hard to fix a frequency.

In a current commercial power system, a consumer terminal has an increasingly higher requirement for conversion efficiency and a transient response capability that are of the power system. Limited by a structure, the current-mode controlled DC-DC converter and the voltage-mode controlled DC-DC converter cannot meet a requirement of a customer. Because it is hard for the hysteresis-mode controlled DC-DC converter to have a fixed operating frequency, the hysteresis-mode controlled DC-DC converter cannot meet a requirement of a frequency-sensitive load.

SUMMARY

Embodiments of the present disclosure provide a voltage conversion circuit and method, and a multiphase parallel power system to resolve a problem of an unfixed operating frequency of a hysteresis-mode DC-DC converter.

According to a first aspect, an embodiment of the present disclosure provides a voltage conversion circuit, where the voltage conversion circuit is configured to convert a first direct current voltage into a second direct current voltage, and includes a voltage conversion subcircuit and a feedback loop, where the voltage conversion subcircuit includes a power transistor, a first energy storage element, and a second energy storage element, and is configured to control conduction and cutoff of the power transistor to control the first energy storage element and the second energy storage element to receive and store energy of the first direct current voltage in order to output the second direct current voltage at a connection end of the first energy storage element and the second energy storage element, and the feedback loop includes a sampling and amplification circuit, a feedback circuit, and a comparator circuit, the sampling and amplification circuit is configured to sample the second direct current voltage, and input a sampling signal obtained by means of sampling to the comparator circuit. The feedback circuit is configured to sample the second direct current voltage, combine the sampled second direct current voltage and a frequency-controllable triangular wave signal into a frequency-controllable feedback ripple signal, and input the frequency-controllable feedback ripple signal to the comparator circuit, and the comparator circuit is configured to compare the sampling signal with the frequency-controllable feedback ripple signal, and output a frequency-controllable pulse width modulated PWM signal, where the frequency-controllable PWM signal is used to control the conduction and the cutoff of the power transistor, and a frequency of the frequency-controllable PWM signal is the same as a frequency of the frequency-controllable feedback ripple signal.

With reference to the first aspect, in a first possible implementation manner of the first aspect, the feedback circuit includes a triangular wave signal generator, a frequency control subcircuit, and a direct current control subcircuit, and the triangular wave signal generator is configured to generate the frequency-controllable triangular wave signal. The frequency control subcircuit is configured to enable the frequency of the frequency-controllable feedback ripple signal to be the same as a frequency of the frequency-controllable triangular wave signal, and the direct current control subcircuit is configured to control a direct current component voltage of the frequency-controllable feedback ripple signal according to the second direct current voltage and a direct current component of the frequency-controllable triangular wave signal.

With reference to the first possible implementation manner of the first aspect, in a second possible implementation manner of the first aspect, the frequency control subcircuit includes a first capacitor and a second capacitor, and the direct current control subcircuit includes a first resistor and a second resistor, and the triangular wave signal generator is connected to the comparator circuit using the first capacitor. The second capacitor is connected between the comparator circuit and the connection end of the first energy storage element and the second energy storage element. The first resistor is connected between the comparator circuit and the connection end of the first energy storage element and the second energy storage element, and the second resistor is connected between the comparator circuit and a ground terminal.

With reference to the first aspect, or the first or the second possible implementation manner of the first aspect, in a third possible implementation manner of the first aspect, the sampling and amplification circuit includes a bleeder sampling circuit and an error amplification circuit, and the bleeder sampling circuit is configured to perform bleeder sampling on the second direct current voltage to obtain a bleeder sampling signal, and input the bleeder sampling signal to the error amplification circuit. The error amplification circuit is configured to compare the bleeder sampling signal with a preset reference voltage signal, and amplify a difference signal of the bleeder sampling signal and the preset reference voltage signal to obtain the sampling signal, and input the sampling signal to the comparator circuit.

With reference to the third possible implementation manner of the first aspect, in a fourth possible implementation manner of the first aspect, the bleeder sampling circuit includes a third resistor and a fourth resistor, the third resistor is connected between the error amplification circuit and the connection end of the first energy storage element and the second energy storage element, and the fourth resistor is connected between the error amplification circuit and the ground terminal.

With reference to any one of the first aspect, or the first to the fourth possible implementation manners of the first aspect, in a fifth possible implementation manner of the first aspect, the feedback loop further includes a logic circuit and a drive circuit, and an output end of the comparator circuit is connected to the power transistor by successively using the logic circuit and the drive circuit, and the logic circuit is configured to compare the frequency-controllable PWM signal with a preset control logic signal to obtain a control signal using which the conduction and the cutoff of the power transistor are controlled, and the drive circuit is configured to convert the control signal into a drive signal that has a current driving capability, and set the drive signal to control the conduction and the cutoff of the power transistor.

With reference to any one of the first aspect, or the first to the fifth possible implementation manners of the first aspect, in a sixth possible implementation manner of the first aspect, the power transistor includes a first power transistor and a second power transistor. The second power transistor is cut off when the first power transistor is conducted, and the second power transistor is conducted when the first power transistor is cut off, and the first energy storage element and the second energy storage element are coupled to the first power transistor and the second power transistor, and when the first power transistor is conducted and the second power transistor is cut off, the first direct current voltage charges the second energy storage element through the first energy storage element, or when the first power transistor is cut off and the second power transistor is conducted, the second energy storage element is discharged through the first energy storage element using the second power transistor.

With reference to any one of the first aspect, or the first to the fifth possible implementation manners of the first aspect, in a seventh possible implementation manner of the first aspect, the power transistor includes a first power transistor and a second power transistor, the second power transistor is cut off when the first power transistor is conducted, and the second power transistor is conducted when the first power transistor is cut off, and the first energy storage element and the second energy storage element are coupled to the first power transistor and the second power transistor, and when the first power transistor is conducted and the second power transistor is cut off, the first direct current voltage stores energy using the first energy storage element, and the second energy storage element is discharged, or when the first power transistor is cut off and the second power transistor is conducted, the first energy storage element releases energy using the second power transistor, and the first energy storage element and the first direct current voltage charge the second energy storage element.

With reference to any one of the first aspect, or the first to the fifth possible implementation manners of the first aspect, in an eighth possible implementation manner of the first aspect, the power transistor includes a first power transistor, a second power transistor, a third power transistor, and a fourth power transistor. The second power transistor is cut off when the first power transistor is conducted, the second power transistor is conducted when the first power transistor is cut off, the fourth power transistor is cut off when the third power transistor is conducted, and the fourth power transistor is conducted when the third power transistor is cut off. The first energy storage element and the second energy storage element are coupled to the third power transistor and the fourth power transistor, and the first energy storage element is further coupled to the first power transistor and the second power transistor, when the first power transistor is conducted and the second power transistor is cut off, if the third power transistor is conducted and the fourth power transistor is cut off, the first direct current voltage stores energy using the first energy storage element, and the second energy storage element is discharged, or if the third power transistor is cut off and the fourth power transistor is conducted, the first energy storage element releases energy using the fourth power transistor, and the first energy storage element and the first direct current voltage charge the second energy storage element, and when the third power transistor is cut off and the fourth power transistor is conducted, if the first power transistor is conducted and the second power transistor is cut off, the first direct current voltage charges the second energy storage element through the first energy storage element, or if the first power transistor is cut off and the second power transistor is conducted, the second energy storage element is discharged through the first energy storage element using the second power transistor.

According to a second aspect, an embodiment of the present disclosure provides a multiphase parallel power system, including multiple voltage conversion circuits according to any one of the first aspect, or the first to the eighth possible implementation manners of the first aspect, where the frequency-controllable triangular wave signals in all the voltage conversion circuits have a same frequency, and a phase difference between the frequency-controllable triangular wave signals in the voltage conversion circuits with consecutive phases is a result of dividing 360 degrees (°) by a quantity of voltage conversion circuits, and all the voltage conversion circuits share one sampling and amplification circuit.

According to a third aspect, an embodiment of the present disclosure provides a voltage conversion method, including controlling conduction and cutoff of a power transistor to control a first energy storage element and a second energy storage element to receive and store energy of a first direct current voltage in order to output a second direct current voltage at a connection end of the first energy storage element and the second energy storage element, sampling the second direct current voltage to obtain a sampling signal, sampling the second direct current voltage, combining the sampled second direct current voltage and a frequency-controllable triangular wave signal to a frequency-controllable feedback ripple signal, comparing the sampling signal with the frequency-controllable feedback ripple signal, and outputting a frequency-controllable pulse width modulated PWM signal, where the frequency-controllable PWM signal is used to control the conduction and the cutoff of the power transistor, and a frequency of the frequency-controllable PWM signal is the same as a frequency of the frequency-controllable feedback ripple signal.

With reference to the third aspect, in a first possible implementation manner of the third aspect, the method includes generating the frequency-controllable triangular wave signal, enabling the frequency of the frequency-controllable feedback ripple signal to be the same as a frequency of the frequency-controllable triangular wave signal, and controlling a direct current component voltage of the frequency-controllable feedback ripple signal according to the second direct current voltage and a direct current component of the frequency-controllable triangular wave signal.

With reference to the third aspect or the first possible implementation manner of the third aspect, in a second possible implementation manner of the third aspect, sampling the second direct current voltage to obtain a sampling signal includes performing bleeder sampling on the second direct current voltage to obtain a bleeder sampling signal, comparing the bleeder sampling signal with a preset reference voltage signal, and amplifying a difference between the bleeder sampling signal and the preset reference voltage signal to obtain the sampling signal.

With reference to the third aspect, or the first or the second possible implementation manner of the third aspect, in a third possible implementation manner of the third aspect, the method further includes comparing the frequency-controllable PWM signal with a preset control logic signal to obtain a control signal using which the conduction and the cutoff of the power transistor are controlled, converting the control signal into a drive signal that has a current driving capability, and setting the drive signal to control the conduction and the cutoff of the power transistor.

With reference to any one of the third aspect, or the first to the third possible implementation manners of the third aspect, in a fourth possible implementation manner of the third aspect, the power transistor includes a first power transistor and a second power transistor, and controlling conduction and cutoff of a power transistor to control a first energy storage element and a second energy storage element to receive and store energy of a first direct current voltage includes controlling the second power transistor to be cut off when the first power transistor is conducted, controlling the second power transistor to be conducted when the first power transistor is cut off, and charging, by the first direct current voltage, the second energy storage element through the first energy storage element when the first power transistor is conducted and the second power transistor is cut off, or discharging the second energy storage element through the first energy storage element using the second power transistor when the first power transistor is cut off and the second power transistor is conducted.

With reference to any one of the third aspect, or the first to the third possible implementation manners of the third aspect, in a fifth possible implementation manner of the third aspect, the power transistor includes a first power transistor and a second power transistor, and controlling conduction and cutoff of a power transistor to control a first energy storage element and a second energy storage element to receive and store energy of a first direct current voltage includes controlling the second power transistor to be cut off when the first power transistor is conducted, controlling the second power transistor to be conducted when the first power transistor is cut off, and when the first power transistor is conducted and the second power transistor is cut off, storing, by the first direct current voltage, energy using the first energy storage element, and discharging the second energy storage element, or when the first power transistor is cut off and the second power transistor is conducted, releasing, by the first energy storage element, energy using the second power transistor, and charging the second energy storage element by the first energy storage element and the first direct current voltage.

With reference to any one of the third aspect, or the first to the third possible implementation manners of the third aspect, in a sixth possible implementation manner of the third aspect, the power transistor includes a first power transistor, a second power transistor, a third power transistor, and a fourth power transistor, and controlling conduction and cutoff of a power transistor to control a first energy storage element and a second energy storage element to receive and store energy of a first direct current voltage includes controlling the second power transistor to be cut off when the first power transistor is conducted, controlling the second power transistor to be conducted when the first power transistor is cut off, controlling the fourth power transistor to be cut off when the third power transistor is conducted, and controlling the fourth power transistor to be conducted when the third power transistor is cut off, when the first power transistor is conducted and the second power transistor is cut off, if the third power transistor is conducted and the fourth power transistor is cut off, storing, by the first direct current voltage, energy using the first energy storage element, and discharging the second energy storage element, or if the third power transistor is cut off and the fourth power transistor is conducted, releasing, by the first energy storage element, energy using the fourth power transistor, and charging the second energy storage element by the first energy storage element and the first direct current voltage, and when the third power transistor is cut off and the fourth power transistor is conducted, if the first power transistor is conducted and the second power transistor is cut off, charging, by the first direct current voltage, the second energy storage element through the first energy storage element, or if the first power transistor is cut off and the second power transistor is conducted, discharging the second energy storage element through the first energy storage element using the second power transistor.

According to the voltage conversion circuit and method, and the multiphase parallel power system in the embodiments of the present disclosure, a feedback circuit provides a frequency-controllable feedback ripple signal. Therefore, an operating frequency of the voltage conversion circuit in the embodiments is controllable, and a frequency requirement of a load may be met. Compensation does not need to be performed in a hysteresis mode, and therefore the hysteresis mode has a fast-speed response, and the operating frequency is fixed. Therefore, the voltage conversion circuit in the embodiments may be applied to the multiphase parallel power system such that the multiphase parallel power system is applicable to an application scenario with a large load current.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show some embodiments of the pres

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. The described embodiments are some but not all of the embodiments of the present disclosure. All other embodiments obtained by persons of ordinary skill in the art based on the embodiments of the present disclosure without creative efforts shall fall within the protection scope of the present disclosure.

According to the embodiments of the present disclosure, a frequency-controllable voltage conversion circuit may be implemented. It should be noted that "frequency-controllable" in the embodiments of the present disclosure further refers to any fixed frequency. For example, the frequency may be 5 hertz (Hz) or 8 Hz. The frequency may be flexibly set according to a load requirement of a voltage conversion circuit, and is not a fixed unique value. For example, when a load requires a frequency of 5 Hz, the voltage conversion circuit in the embodiments of the present disclosure may perform voltage conversion at an operating frequency of 5 Hz, and the operating frequency of the voltage conversion circuit does not change in a circuit operating process.

Figure 1:
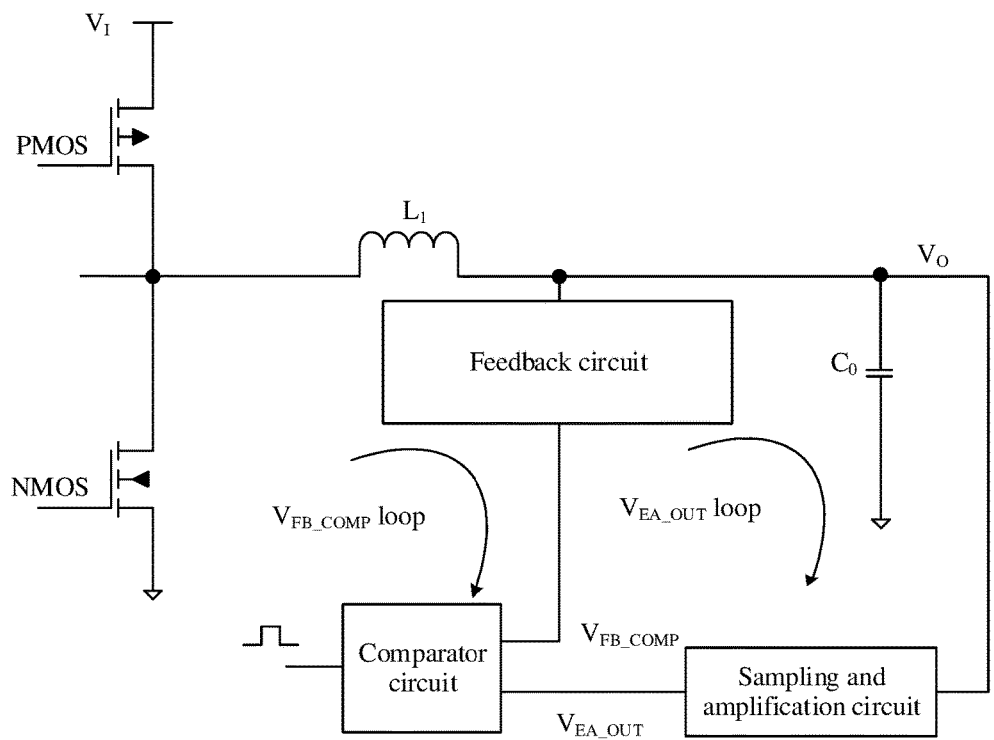
- FIG. 1 is a schematic structural diagram of Embodiment 1 of a voltage conversion circuit according to the present disclosure.

FIG. 1 is a schematic structural diagram of Embodiment 1 of a voltage conversion circuit according to the present disclosure. As shown in FIG. 1, the voltage conversion circuit in this embodiment is configured to convert a first direct current voltage into a second direct current voltage. The voltage conversion circuit in this embodiment may include a voltage conversion subcircuit and a feedback loop.

The voltage conversion subcircuit may include a power transistor (FIG. 1 shows a P-type metal-oxide-semiconductor (PMOS) and an N-type metal-oxide-semiconductor (NMOS). The PMOS and the NMOS shown in FIG. 1 are not constructed as a limitation herein. For example, the power transistor may be a transistor or an insulated-gate bipolar transistor (IGBT)), a first energy storage element ($L_1$), and a second energy storage element ($C_0$). The voltage conversion subcircuit is configured to control conduction and cutoff of the power transistor to control the $L_1$ and the $C_0$ to receive and store energy of the first direct current voltage in order to output the second direct current voltage ($V_O$) at a connection end of the $L_1$ and the $C_0$.

It should be noted that a buck DC-DC conversion circuit is schematically described in FIG. 1. A connection relationship between the power transistor and the $L_1$ in this embodiment is not limited to that shown in FIG. 1. The voltage conversion circuit in this embodiment may be a buck type, a boost type (reference may be made to an embodiment shown in FIG. 5 for details), and a buck-boost type (reference may be made to an embodiment shown in FIG. 6 for details). However, regardless of which type in the foregoing types is the voltage conversion circuit in this embodiment, a principle of the voltage conversion circuit is to charge and discharge the $L_1$ and the $C_0$ using the power transistor in order to convert the first direct current voltage and output the $V_O$.

The feedback loop includes a sampling and amplification circuit, a feedback circuit, and a comparator circuit. The sampling and amplification circuit is configured to sample the $V_O$, and input a sampling signal (designated as $V_{EA\_OUT}$ in FIG. 1) obtained by means of sampling to the comparator circuit (designated as $V_{EA\_OUT}$ loop in FIG. 1). The feedback circuit is configured to sample the $V_O$, combine the sampled $V_O$ and a frequency-controllable triangular wave signal into a frequency-controllable feedback ripple signal, and input the frequency-controllable feedback ripple signal (designated as $V_{FB\_COMP}$ in FIG. 1) to the comparator circuit (designated as $V_{FB\_COMP}$ loop in FIG. 1). The comparator circuit is configured to compare the sampling signal with the frequency-controllable feedback ripple signal, and output a frequency-controllable PWM signal.

The frequency-controllable PWM signal is used to control the conduction and the cutoff of the power transistor, and a frequency of the frequency-controllable PWM signal is the same as a frequency of the frequency-controllable feedback ripple signal.

Further, the sampling and amplification circuit samples the $V_O$, and outputs $V_{EA\_OUT}$ as an input voltage signal of the comparator circuit. The feedback circuit may also sample the $V_O$, and combine the sampled $V_O$ and a frequency-controllable triangular wave signal into a frequency-controllable feedback ripple signal $V_{FB\_COMP}$, and $V_{FB\_COMP}$ is a triangular wave signal. The comparator circuit compares $V_{FB\_COMP}$ with $V_{EA\_OUT}$, and outputs the frequency-controllable PWM signal to adjust the $V_O$.

The buck-type voltage conversion circuit is described as an example. That is, the frequency-controllable PWM signal is used to control conduction and cutoff of a power switch tube (the PMOS and the NMOS). Further, when the PMOS is conducted and the NMOS is cut off, an input power that provides $V_I$ charges the $L_1$ and the $C_0$. When the PMOS is cut off and the NMOS is conducted, the $L_1$ and the $C_0$ are discharged using the NMOS. That is, the frequency-controllable PWM signal is used to control a switching frequency of the voltage conversion circuit in this embodiment in order to convert the input voltage $V_I$ into an output voltage $V_O$.

Compared with a conventional hysteresis-mode controlled DC-DC circuit, the voltage conversion circuit in this embodiment may enable the frequency of $V_{FB\_COMP}$ to be controllable using the feedback circuit in order to implement a controllable switching frequency of a hysteresis-mode controlled voltage conversion circuit.

Figure 2:
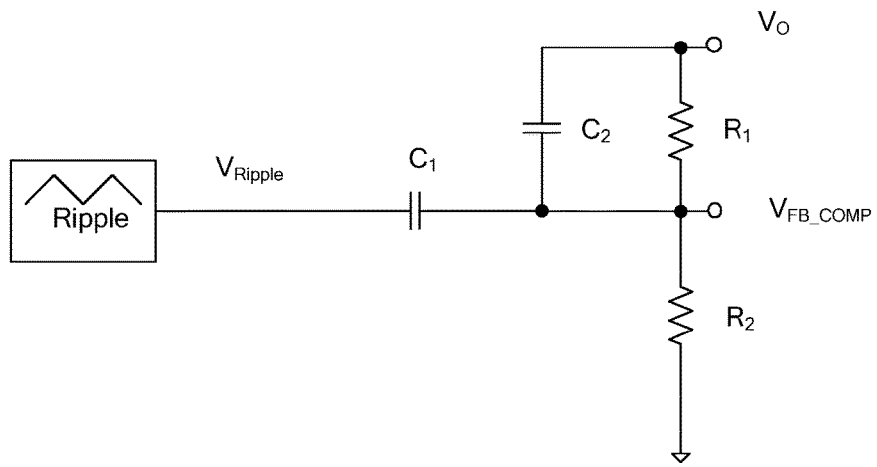
FIG. 2 is a schematic structural diagram of a feedback circuit according to the present disclosure.

FIG. 2 is a schematic structural diagram of a feedback circuit according to the present disclosure. As shown in FIG.

2, the feedback circuit in this embodiment may include a triangular wave signal generator, a frequency control subcircuit, and a direct current control subcircuit.

The triangular wave signal generator is configured to generate the frequency-controllable triangular wave signal Ripple. The frequency control subcircuit is configured to enable a frequency of a frequency-controllable feedback ripple signal to be the same as a frequency of the frequency-controllable triangular wave signal. The direct current control subcircuit is configured to control a direct current component voltage of the frequency-controllable feedback ripple signal according to a second direct current voltage and a direct current component of the frequency-controllable triangular wave signal.

Further, the frequency control subcircuit includes a first capacitor ($C_1$) and a second capacitor ($C_2$). The direct current control subcircuit includes a first resistor ($R_1$) and a second resistor ($R_2$).

The triangular wave signal generator is connected to the comparator circuit using the $C_1$. The $C_2$ is connected between the comparator circuit and the connection end of the first energy storage element (i.e., $L_1$ in FIG. 1) and the second energy storage element (i.e., $C_0$ in FIG. 1). The $R_1$ is connected between the comparator circuit and the connection end of the first energy storage element and the second energy storage element. The $R_2$ is connected between the comparator circuit and a ground terminal.

As shown in FIG. 2, a node between the $C_1$ and the $C_2$ and a node between the $R_1$ and the $R_2$ are connected to a node at which a voltage signal is the frequency-controllable feedback ripple signal $V_{FB\_COMP}$, and $V_{FB\_COMP}$ is obtained by superposing $V_{Ripple}$ and $V_O$, where $V_{Ripple}$ is a frequency-controllable triangular wave signal, and $V_O$ is a direct current voltage signal. $V_{Ripple}$ and $V_O$ are separately shorted to ground according to a superposition principle to calculate corresponding expressions. The corresponding expressions are added to obtain an s-domain expression of $V_{FB\_COMP}$, that is, a formula (1).

$$V_{FB\_COMP} = V_{Ripple} \cdot A(s) + V_o \cdot B(s)$$
$$= V_{Ripple} \cdot \frac{R_1 R_2 [(C_1 R_1 + C_1 R_2) \cdot s + C_1 C_2 R_1 R_2 \cdot s^2]}{(R_1 + R_2 + C_2 R_1 R_2 \cdot s) \cdot} + $$
$$[R_1 + R_2 + (C_1 R_1 R_2 + C_2 R_1 R_2) \cdot s]$$
$$V_o \cdot \frac{C_1 R_2 \cdot (C_1 R_1 R_2 + C_2 R_1 R_2) \cdot R_2 (C_2 R_1 \cdot s + 1)(C_1 R_2 \cdot s + 1)}{\left(\frac{s+1}{C_1 R_2}\right)[s + (R_1 + R_2)/(C_1 R_1 R_2 + C_2 R_1 R_2)]} \quad (1)$$

It can be seen from the formula (1) that $V_{FB\_COMP}$ includes two parts. One part is determined according to $V_{Ripple}$, and the other part is determined according to $V_O$. When $s \to 0$, and $A(s) \to 0$, the part related to $V_{Ripple}$ in the foregoing formula (1) is 0, and the expression of $V_{FB\_COMP}$ is a formula (2).

$$V_{FB\_COMP} = V_o \cdot \frac{R_2}{R_1 + R_2} \quad (2)$$

That is, a direct current part of $V_{FB\_COMP}$ is determined according to a divided voltage of $V_O$.

It may be learned from the foregoing analysis that the $C_1$ obstructs a direct current part of the frequency-controllable triangular wave signal Ripple such that the direct current part of the $V_{FB\_COMP}$ is related only to $V_O$, and the $C_2$ obstructs a direct current part of $V_O$ such that an alternating current part of $V_{FB\_COMP}$ is related only to the frequency-controllable triangular wave signal Ripple. Therefore, because the frequency of the frequency-controllable triangular wave signal Ripple is controllable, the frequency of $V_{FB\_COMP}$ is controllable.

Optionally, the frequency-controllable triangular wave signal includes a frequency-fixed triangular wave signal. Correspondingly, the frequency-controllable feedback ripple signal includes a frequency-fixed feedback voltage signal.

The feedback circuit in this embodiment of the present disclosure is applied to a hysteresis-mode controlled DC-DC converter. The frequency of $V_{Ripple}$ in the feedback circuit in this embodiment of the present disclosure is controllable. It may be learned from the foregoing analysis that the frequency of the frequency-controllable feedback ripple signal $V_{FB\_COMP}$ p is controllable, and a direct current component of the frequency-controllable feedback ripple signal is the same as that in a conventional hysteresis mode, and is determined according to an output voltage signal. Therefore, the feedback circuit in this embodiment of the present disclosure may be used to implement a controllable switching frequency of the hysteresis-mode controlled DC-DC converter, and has a strong transient response capability.

To more clearly understand that the feedback circuit in the present disclosure is configured to implement a fixed switching frequency of the hysteresis-mode controlled DC-DC converter, the following describes an example of a buck hysteresis-mode controlled DC-DC converter. It should be noted that the feedback circuit in the present disclosure may also be applied to a boost hysteresis-mode controlled DC-DC converter (reference may be made to an embodiment shown in FIG. 5) and a buck-boost hysteresis-mode controlled DC-DC converter (reference may be made to an embodiment shown in FIG. 6) to implement a fixed switching frequency.

Figure 3:
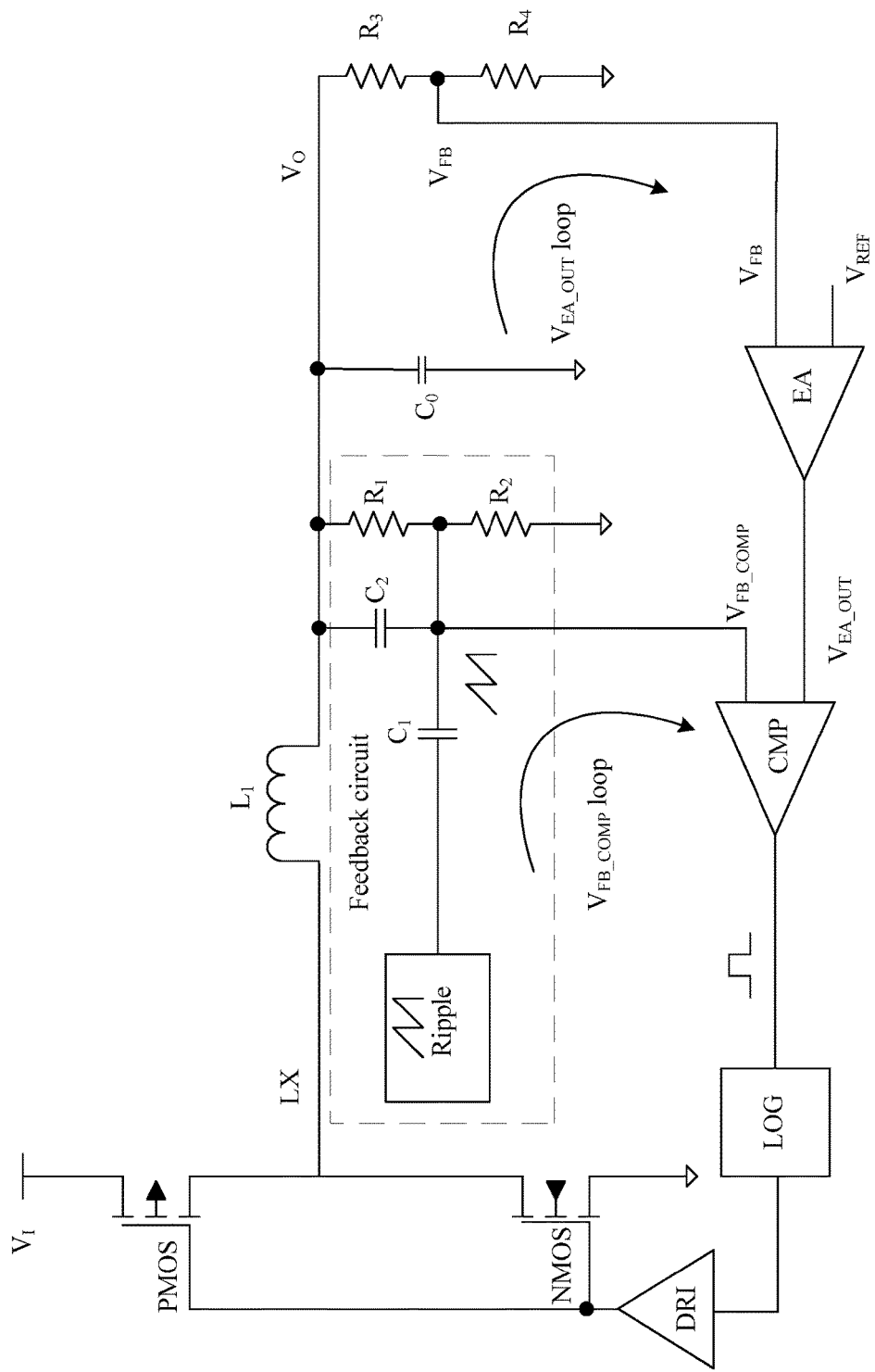
FIG. 3 is a schematic structural diagram of Embodiment 2 of a voltage conversion circuit according to the present disclosure.

FIG. 3 is a schematic structural diagram of Embodiment 2 of a voltage conversion circuit according to the present disclosure. This embodiment is a specific embodiment in which the feedback circuit shown in FIG. 2 is applied to a buck hysteresis-mode controlled DC-DC converter. As shown in FIG. 3, a comparator circuit in this embodiment is described using a comparator (designated as CMP) as an example. The voltage conversion circuit in this embodiment may include a first power transistor (a PMOS), a second power transistor (an NMOS), an inductor ($L_1$), a capacitor ($C_0$), a feedback circuit, a comparator, a sampling and amplification circuit, a logic circuit (designated as LOG), and a drive circuit (designated as DRI).

The sampling and amplification circuit may include a bleeder sampling circuit and an error amplification circuit. The bleeder sampling circuit is configured to perform bleeder sampling on the $V_O$ to obtain a bleeder sampling signal $V_{FB}$, and input the bleeder sampling signal $V_{FB}$ to the error amplification (designated as EA) circuit. The EA circuit is configured to compare the bleeder sampling signal $V_{FB}$ with a preset reference voltage signal $V_{REF}$, and amplify a difference signal of the bleeder sampling signal $V_{FB}$ and the preset reference voltage signal $V_{REF}$ to obtain the sampling signal $V_{EA\_OUT\_}$, and input the sampling signal $V_{EA\_OUT\_}$ to the comparator circuit. The bleeder sampling circuit includes a third resistor $R_3$ and a fourth resistor $R_4$. The third resistor $R_3$ is connected between the EA circuit and a connection end of the $L_1$ and the $C_0$. The fourth resistor $R_4$ is connected between the EA circuit and a ground terminal.

It should be noted that the sampling and amplification circuit ($R_3$, $R_4$, and EA) shown in FIG. 3 is only schematically described, and the sampling and amplification circuit in this embodiment of the present disclosure is not limited thereto.

An output end of the comparator circuit is connected to the power transistor by successively using the logic circuit and the drive circuit. The logic circuit is configured to compare the frequency-controllable PWM signal with a preset control logic signal to obtain a control signal using which the conduction and the cutoff of the power transistor are controlled. The drive circuit is configured to convert the control signal into a drive signal that has a current driving capability, and use the drive signal to control the conduction and the cutoff of the power transistor. The power transistor includes the first power transistor (the PMOS) and the second power transistor (the NMOS).

The $L_1$ and the $C_O$ are respectively used as the first energy storage element and the second energy storage element in the foregoing embodiment.

The feedback circuit includes a first capacitor ($C_1$), a second capacitor ($C_2$), a first resistor ($R_1$), a second resistor ($R_2$), and a triangular wave signal generator. The triangular wave signal generator is configured to generate a frequency-controllable triangular wave signal Ripple. A connection relationship between various parts of the feedback circuit is as follows. The $C_1$ and the $C_2$ are connected to each other in series. An end of the $C_1$ and the $C_2$ that are connected to each other in series is connected to the triangular wave signal generator, and the other end is connected to an output node. A voltage of the output node is $V_O$. The $R_1$ and the $R_2$ are connected to each other in series. An end of the $R_1$ and the $R_2$ that are connected to each other in series is connected to the output node, and the other end is connected to ground. A node between the $C_1$ and the $C_2$ is connected to a node between the $R_1$ and the $R_2$. That is, the feedback circuit in this embodiment and the feedback circuit shown in FIG. 2 have a same structure.

A specific connection relationship of the voltage conversion circuit in this embodiment is as follows. The first power transistor (i.e., the PMOS) and the second power transistor (i.e., the NMOS) are connected to each other in series. A first terminal of the first power transistor is connected to a positive electrode $V_I$ of an input voltage source. A second terminal of the first power transistor is connected, at a first connection point, to a second terminal of the second power transistor (i.e., the NMOS). A third terminal of the first power transistor is connected, at a second connecting point (LX), to a first terminal of the second power transistor. A third terminal of the second power transistor is connected to ground. An end of the $L_1$ is connected to the LX, and the other end is connected to the output node. The comparator and an error amplifier (i.e., EA) are connected to each other in series. An output end of the comparator is connected to the first connection point. A first input end of the comparator is connected to the node between the $C_1$ and the $C_2$. A second input end of the comparator is connected to an output end of the EA. A first input end of the EA is connected to the output node $V_0$ using a feedback resistor. A second input end of the error amplifier is connected to the reference voltage signal $V_{REF}$.

Further, the first power transistor PMOS and the second power transistor NMOS in this embodiment may be metal-oxide-semiconductor (MOS) transistors. The first power transistor PMOS is a P-type MOS transistor, and the second power transistor NMOS is an N-type MOS transistor. Correspondingly, the first terminal is a drain electrode, the second terminal is a gate electrode, and the third terminal is a source electrode. That is, a drain electrode of the first power transistor PMOS is connected to the positive electrode of the input voltage $V_I$, a source electrode of the first power transistor PMOS is connected to a drain electrode of the second power transistor NMOS, a gate electrode of the first power transistor PMOS is connected to a gate electrode of the second power transistor NMOS, and a source electrode of the second power transistor NMOS is connected to the ground.

Optionally, the first power transistor and the second power transistor in this embodiment may also be transistors. The first power transistor is a PNP-type transistor, and the second power transistor is an NPN-type transistor. Correspondingly, the first terminal is a collector, the second terminal is a base, and the third terminal is an emitter. That is, a collector of the first power transistor is connected to the positive electrode of the input voltage $V_I$, an emitter of the first power transistor is connected to a collector of the second power transistor, and a base of the first power transistor is connected to a base of the second power transistor. An emitter of the second power transistor is connected to the ground.

A specific operating manner of the voltage conversion circuit in this embodiment is as follows. The feedback circuit provides a frequency-fixed feedback ripple signal ($V_{FB\_COMP}$), and $V_{FB\_COMP}$ is compared with $V_{EA\_OUT}$ to output a frequency-fixed PWM signal. When the frequency-fixed PWM signal is at a high level, the first power transistor (i.e., the PMOS) is conducted, the second power transistor (i.e., the NMOS) is cut off, and the input voltage $V_I$ charges the $L_1$ and the $C_0$. Afterwards, when the frequency-fixed PWM signal turns to a low level, the first power transistor is cut off, the second power transistor is conducted, and the $L_1$ and the $C_0$ are discharged. That is, the frequency-fixed PWM signal is used to control a switching frequency of the voltage conversion circuit in this embodiment in order to convert the input voltage $V_I$ into an output voltage $V_O$.

In the voltage conversion circuit in this embodiment, a feedback circuit is coupled to a frequency-fixed triangular wave signal. Therefore, the voltage conversion circuit in this embodiment has a fixed an operating frequency, and a requirement of a load for a fixed frequency may be met. Compensation does not need to be performed in a hysteresis mode, and therefore the hysteresis mode has a fast-speed response. The operating frequency is fixed. Therefore, the voltage conversion circuit in this embodiment may be applied to a multiphase parallel power system such that the multiphase parallel power system is applicable to an application scenario with a large load current.

The following describes a diagram of an operating waveform of a key node in the foregoing embodiment as a supplementary explanation of the foregoing embodiment.

Figure 4:
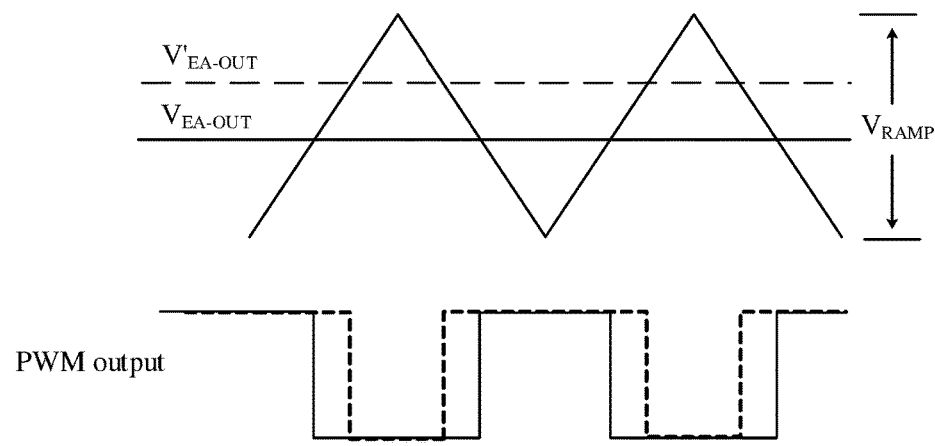
FIG. 4 is a schematic diagram of an operating waveform of a key node in a voltage conversion circuit according to the present disclosure.

FIG. 4 is a schematic diagram of an operating waveform of a key node in a voltage conversion circuit according to the present disclosure. As shown in FIG. 4, a triangular waveform is an operating waveform of a node between the $C_1$ and the $C_2$ in FIG. 3, that is, an operating waveform of a first input $V_{FB\_COMP}$ of the CMP. When an output of the EA is $V_{EA\_OUT}$, an output of the CMP (a PWM output) is a solid-line rectangular wave in FIG. 4.

Further, when $V_{FB\_COMP}$ undercrosses $V_{EA\_OUT}$, a PWM signal turns to a high level. Correspondingly, a first power transistor PMOS in FIG. 3 is conducted, and a second power transistor NMOS in FIG. 3 is cut off. When $V_{FB\_COMP}$ crosses $V_{EA\_OUT}$, the PWM signal turns to a low level. Correspondingly, the first power transistor PMOS in FIG. 3 is cut off, and the second power transistor NMOS in FIG. 3 is conducted. When a voltage conversion circuit in FIG. 3 has a stable output voltage, relative locations of $V_{FB\_COMP}$ and $V_{EA\_OUT}$ do not change, and a frequency of a signal that is output by a PWM and that is obtained by comparing $V_{FB\_COMP}$ and $V_{EA\_OUT}$ does not change. The frequency is determined according to a frequency of $V_{FB\_COMP}$.

It may be learned from this that the voltage conversion circuit in the foregoing embodiment of the present disclosure has a fixed operating frequency.

In addition, a duty cycle of a PWM signal output by the CMP in this embodiment of the present disclosure may be controlled using an output of the EA. Further, when the relative locations of $V_{FB\_COMP}$ and $V_{EA\_OUT}$ change, as shown in FIG. 4, when $V_{EA\_OUT}$ moves upwards to $V'_{EA\_OUT}$, the PWM pulse width modulated signal output by the comparator CMP is adjusted to a dashed-line rectangular wave in FIG. 4. A conducting time and a cutoff time of the first power transistor and those of the second power transistor are adjusted by changing the duty cycle of the PWM signal output by the CMP in order to ensure that the output voltage becomes stable.

As shown in FIG. 4, if $V_{EA\_OUT}$ approximates to a reference voltage, a central value of $V_{FB\_COMP}$ is $V_{FB\_COMP}$, and a peak-to-peak value of a waveform signal is $V_{RAMP}$, the duty cycle may be expressed as a formula (3):

$$D = \frac{V_{EA\_OUT} - (V_{FB\_COMP} - V_{RAMP}/2)}{V_{RAMP}}. \quad (3)$$

The following may be obtained according to the formula (3):

$$\frac{\partial D}{\partial V_{FB\_COMP}} = -\frac{1}{V_{RAMP}}$$

It may be seen from this that a gain of the PWM signal in the voltage conversion circuit of the present disclosure is calculated in a same manner as a gain in a common voltage mode. A value of $R_{RAMP}$ determines the gain in the PWM signal. A peak-to-peak value of an alternating current (AC) component ripple of $V_{FB\_COMP}$ may be adjusted to adjust a gain and bandwidth of $V_{FB\_COMP}$ loop in a hysteresis-mode DC-DC conversion circuit of the present disclosure in order to improve a transient response capability of the hysteretic-mode DC-DC conversion circuit.

It is easier to improve the operating efficiency of the voltage conversion circuit in this embodiment of the present disclosure, thereby implementing a hysteresis-mode DC-DC conversion circuit with a high frequency and a high transient performance.

Figure 5:
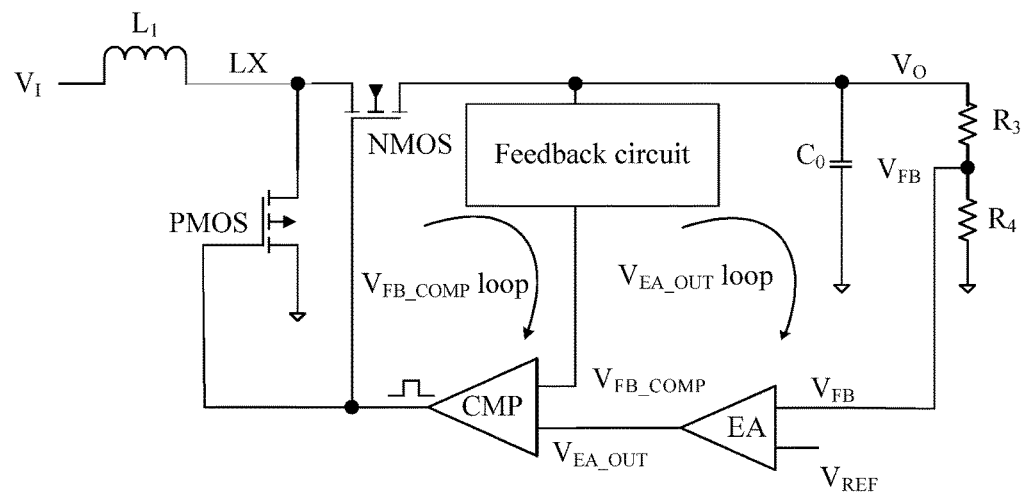
FIG. 5 is a schematic structural diagram of Embodiment 3 of a voltage conversion circuit according to the present disclosure.

FIG. 5 is a schematic structural diagram of Embodiment 3 of a voltage conversion circuit according to the present disclosure. This embodiment is a specific embodiment in which the feedback circuit shown in FIG. 2 is applied to the boost hysteresis-mode controlled DC-DC converter. The voltage conversion circuit in this embodiment is applied to the boost hysteresis-mode controlled DC-DC converter using the feedback circuit. Therefore, a switching frequency of a hysteresis-mode controlled DC-DC converter may be controllable, an operating frequency of the boost hysteresis-mode controlled DC-DC converter in this embodiment is controllable, and a requirement of a load for a fixed frequency may be met. Compensation does not need to be performed in a hysteresis mode, and therefore the hysteresis mode has a fast-speed response. The operating frequency is fixed. Therefore, the voltage conversion circuit in this embodiment may be applied to a multiphase parallel power system such that the multiphase parallel power system is applicable to an application scenario with a large load current.

A specific operating manner of the voltage conversion circuit is as follows. The feedback circuit provides a frequency-controllable feedback ripple signal (i.e., $V_{FB\_COMP}$), and $V_{FB\_COMP}$ is compared with $V_{EA\_OUT}$ to output a frequency-controllable PWM signal. When the frequency-controllable PWM signal is at a high level, a first power transistor (i.e., a PMOS) is conducted, a second power transistor (i.e., an NMOS) is cut off, and a first direct current voltage charges a second energy storage element (i.e., $C_O$) through a first energy storage element (i.e., $L_1$). When the frequency-controllable PWM signal is at a low level, the first power transistor is cut off, the second power transistor is conducted, and the second energy storage element is discharged through the first energy storage element using the second power transistor. That is, the frequency-controllable PWM signal is used to control a switching frequency of the voltage conversion circuit in this embodiment in order to convert an input voltage $V_I$ into an output voltage $V_O$.

Figure 6:
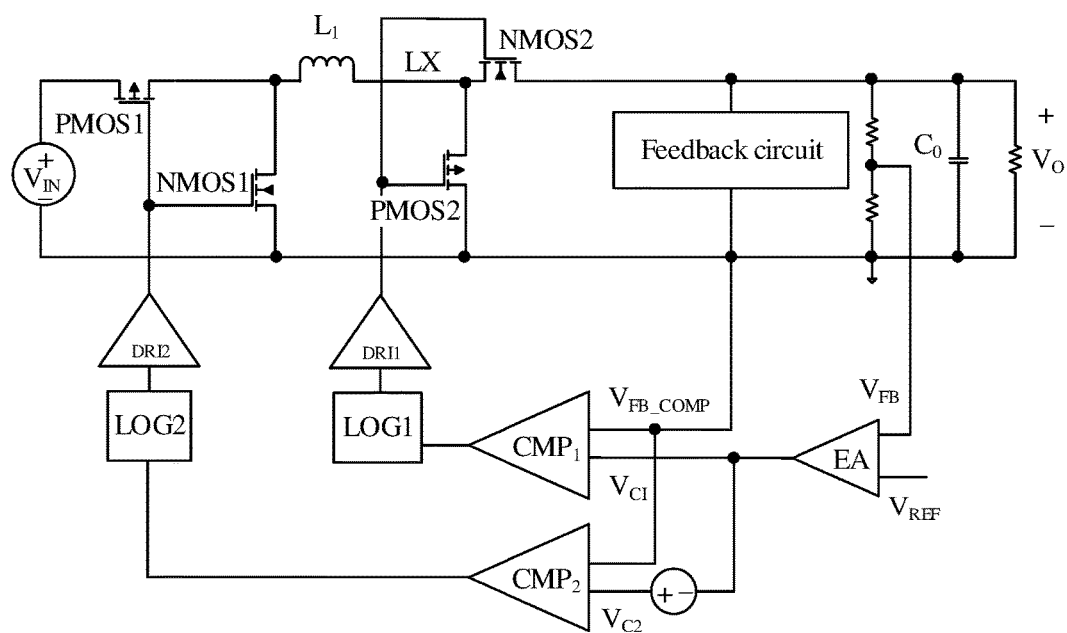
FIG. 6 is a schematic structural diagram of Embodiment 4 of a voltage conversion circuit according to the present disclosure.

FIG. 6 is a schematic structural diagram of Embodiment 4 of a voltage conversion circuit according to the present disclosure. This embodiment is a specific embodiment in which the feedback circuit shown in FIG. 2 is applied to the buck-boost hysteresis-mode controlled DC-DC converter. The voltage conversion circuit in this embodiment is applied to the buck-boost hysteresis-mode controlled DC-DC converter using the feedback circuit. Therefore, a switching frequency of a hysteresis-mode controlled DC-DC converter may be controllable, an operating frequency of the buck-boost hysteresis-mode controlled DC-DC converter in this embodiment is controllable, and a requirement of a load for a fixed frequency may be met. Compensation does not need to be performed in a hysteresis mode, and therefore the hysteresis mode has a fast-speed response. The operating frequency is fixed. Therefore, the voltage conversion circuit in this embodiment may be applied to a multiphase parallel power system such that the multiphase parallel power system is applicable to an application scenario with a large load current.

A specific operating manner of the voltage conversion circuit is as follows. The feedback circuit provides a frequency-controllable feedback ripple signal (i.e., $V_{FB\_COMP}$), and $V_{FB\_COMP}$ is separately provided to two comparators (designated as $CMP_1$ and $CMP_2$). The $CMP_1$ compares $V_{FB\_COMP}$ with $V_{C1}$, and outputs a frequency-controllable PWM signal to control conduction or cutoff of a third power transistor (PMOS2) and a fourth power transistor (NMOS2). The $CMP_2$ compares $V_{FB\_COMP}$ with $V_{C2}$, and outputs a frequency-controllable PWM signal to control conduction and cutoff of a first power transistor (PMOS1) and a second power transistor (NMOS1). When the PMOS1 is conducted and the NMOS1 is cut off, a circuit shown in FIG. 6 is a step-up circuit. That is, if the PMOS2 is controlled to be conducted and the NMOS2 is controlled to be cut off, a first direct current voltage ($V_{IN}$) stores energy through a first energy storage element ($L_1$), and a second energy storage element ($C_O$) is discharged. If the PMOS2 is controlled to be cut off and the NMOS2 is controlled to be conducted, the $L_1$ releases energy using the NMOS2, and the $L_1$ and the $V_{IN}$ charges the $C_O$.

When the PMOS2 is cut off and the NMOS2 is conducted, the circuit shown in FIG. 6 is a step-down circuit. That is, if the PMOS1 is controlled to be conducted and the NMOS1 is controlled to be cut off, the $V_{IN}$ charges the $C_0$ through the $L_1$. If the PMOS1 is controlled to be cut off and the NMOS1 is controlled to be conducted, the $C_0$ is discharged through the $L_1$ using the NMOS1.

That is, the frequency-controllable PWM signal is used to control a switching frequency of the voltage conversion circuit in this embodiment in order to convert an input voltage $V_{IN}$ into an output voltage $V_O$.

Figure 7:
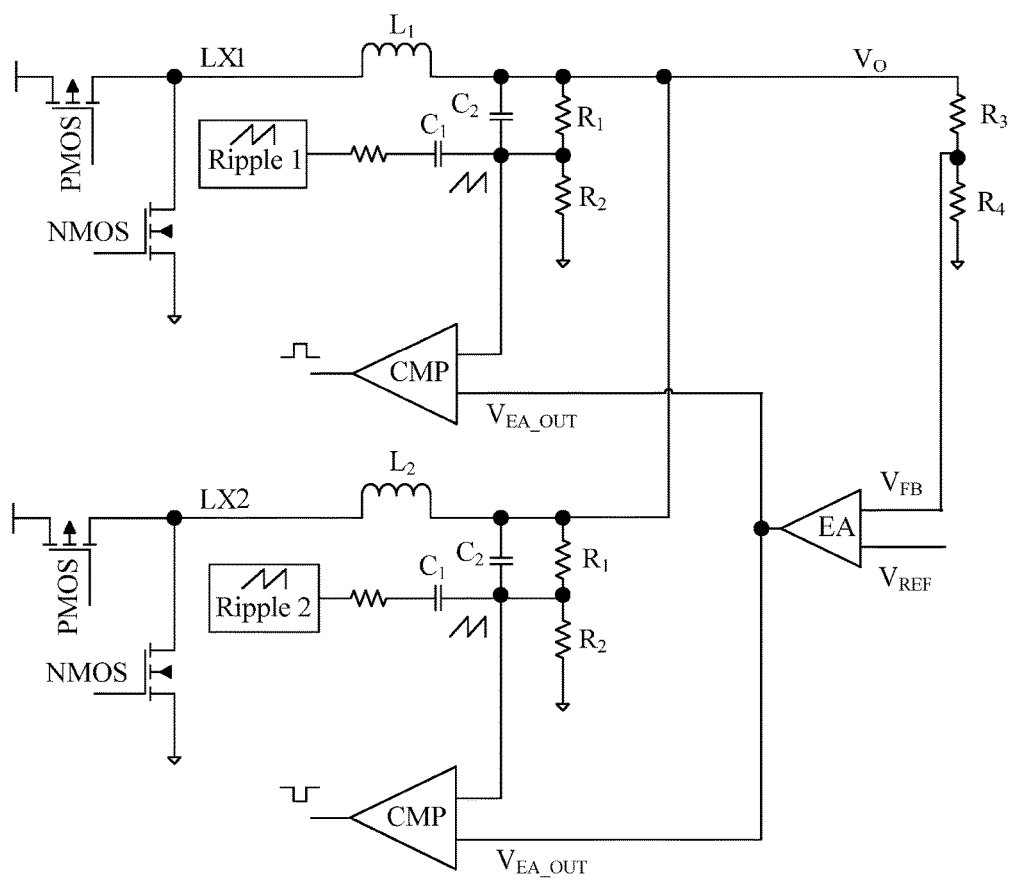
FIG. 7 is a schematic structural diagram of a multiphase parallel power system according to the present disclosure.

FIG. 7 is a schematic structural diagram of a multiphase parallel power system according to the present disclosure. As shown in FIG. 7, the multiphase parallel power system in this embodiment of the present disclosure includes multiple voltage conversion circuits shown in FIG. 3. The frequency-controllable triangular wave signals in all the voltage conversion circuits have a same frequency, and a phase difference between the frequency-controllable triangular wave signals in the voltage conversion circuits with consecutive phases is a result of dividing 360° by a quantity of voltage conversion circuits. All the voltage conversion circuits share one sampling and amplification circuit.

It should be noted that drive circuits and logic circuits that are of all the voltage conversion circuits are mutually independent, that is, each voltage conversion circuit independently uses a drive circuit and a logic circuit.

All voltage conversion circuits have a same input voltage source.

A quantity of the voltage conversion circuit may be two, three, or the like. Two voltage conversion circuits are used as an example. For example, two voltage conversion circuits in this embodiment of the present disclosure are connected in parallel to implement a two-phase parallel power system. A phase difference between frequency-fixed triangular wave signals in the two voltage conversion circuits is 180°. A phase difference between rectangular waves output by PWM in the two voltage conversion circuits is also 180°, that is, a phase difference between a Ripple 1 and a Ripple 2 is 180°.

In this embodiment, multiple voltage conversion circuits shown in FIG. 3 are applied to a multiphase parallel structure in order to meet an application scenario with a large load current. In addition, an equivalent inductance of the multiphase parallel structure is equal to a result of dividing a single-phase inductance by a phase quantity. A switching frequency of the multiphase parallel structure is equivalent to a result of multiplying a single-phase switching frequency by the phase quantity. Therefore, the multiphase parallel structure may greatly improve a response speed of a loop.

Figure 8:
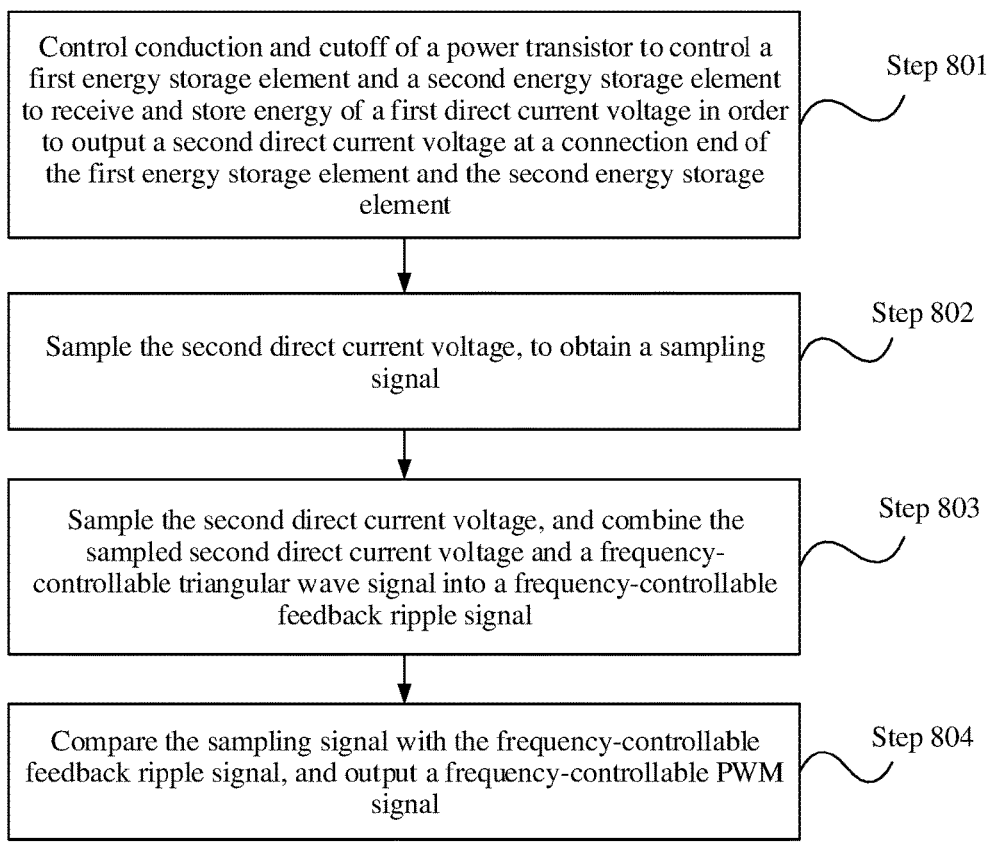
FIG. 8 is a flowchart of a voltage conversion method according to the present disclosure.

FIG. 8 is a flowchart of a voltage conversion method according to the present disclosure. As shown in FIG. 8, the method in the present disclosure may include the following steps.

Step 801: Control conduction and cutoff of a power transistor to control a first energy storage element and a second energy storage element to receive and store energy of a first direct current voltage in order to output a second direct current voltage at a connection end of the first energy storage element and the second energy storage element.

Step 802: Sample the second direct current voltage to obtain a sampling signal.

Step 803: Sample the second direct current voltage, and combine the sampled second direct current voltage and a frequency-controllable triangular wave signal into a frequency-controllable feedback ripple signal.

Step 804: Compare the sampling signal with the frequency-controllable feedback ripple signal, and output a frequency-controllable PWM signal.

The frequency-controllable PWM signal is used to control the conduction and the cutoff of the power transistor, and a frequency of the frequency-controllable PWM signal is the same as a frequency of the frequency-controllable feedback ripple signal.

Optionally, the frequency-controllable triangular wave signal is generated. The frequency of the frequency-controllable feedback ripple signal is enabled to be the same as a frequency of the frequency-controllable triangular wave signal. A direct current component voltage of the frequency-controllable feedback ripple signal is controlled according to the second direct current voltage and a direct current component of the frequency-controllable triangular wave signal.

Optionally, step 802 may further include performing bleeder sampling on the second direct current voltage to obtain a bleeder sampling signal, comparing the bleeder sampling signal with a preset reference voltage signal, and amplifying a difference between the bleeder sampling signal and the preset reference voltage signal to obtain the sampling signal.

Further, the method may further include comparing the frequency-controllable PWM signal with a preset control logic signal to obtain a control signal using which the conduction and the cutoff of the power transistor are controlled, converting the control signal into a drive signal that has a current driving capability, and setting the drive signal to control the conduction and the cutoff of the power transistor.

Optionally, the power transistor may include a first power transistor and a second power transistor. The controlling conduction and cutoff of a power transistor to control a first energy storage element and a second energy storage element to receive and store energy of a first direct current voltage in step 801 may further include controlling the second power transistor to be cut off when the first power transistor is conducted, and controlling the second power transistor to be conducted when the first power transistor is cut off, and charging, by the first direct current voltage, the second energy storage element through the first energy storage element when the first power transistor is conducted and the second power transistor is cut off, or discharging the second energy storage element through the first energy storage element using the second power transistor when the first power transistor is cut off and the second power transistor is conducted.

Optionally, the power transistor may include a first power transistor and a second power transistor. Controlling conduction and cutoff of a power transistor to control a first energy storage element and a second energy storage element to receive and store energy of a first direct current voltage in step 801 may further include controlling the second power transistor to be cut off when the first power transistor is conducted, and controlling the second power transistor to be conducted when the first power transistor is cut off, and when the first power transistor is conducted and the second power transistor is cut off, storing, by the first direct current voltage, energy using the first energy storage element, and discharging the second energy storage element, or when the first power transistor is cut off and the second power transistor is conducted, releasing, by the first energy storage element, energy using the second power transistor, and charging the second energy storage element by the first energy storage element and the first direct current voltage.

Optionally, the power transistor may include a first power transistor, a second power transistor, a third power transistor, and a fourth power transistor. Controlling conduction and cutoff of a power transistor to control a first energy storage element and a second energy storage element to receive and store energy of a first direct current voltage in step 801 may further include controlling the second power transistor to be cut off when the first power transistor is conducted, controlling the second power transistor to be conducted when the first power transistor is cut off, controlling the fourth power transistor to be cut off when the third power transistor is conducted, and controlling the fourth power transistor to be conducted when the third power transistor is cut off, when the first power transistor is conducted and the second power transistor is cut off, if the third power transistor is conducted and the fourth power transistor is cut off, storing, by the first direct current voltage, energy using the first energy storage element, and discharging the second energy storage element, or if the third power transistor is cut off and the fourth power transistor is conducted, releasing, by the first energy storage element, energy using the fourth power transistor, and charging the second energy storage element by the first energy storage element and the first direct current voltage, and when the third power transistor is cut off and the fourth power transistor is conducted, if the first power transistor is conducted and the second power transistor is cut off, charging, by the first direct current voltage, the second energy storage element through the first energy storage element, or if the first power transistor is cut off and the second power transistor is conducted, discharging the second energy storage element through the first energy storage element using the second power transistor.

The method in this embodiment may be used to execute the technical solutions in the method embodiments shown in FIG. 1 to FIG. 7, and implementation principles and technical effects thereof are similar. Details are not repeatedly described herein.

Persons of ordinary skill in the art may understand that all or some of the steps of the method embodiments may be implemented by a program instructing relevant hardware. The program may be stored in a computer-readable storage medium. When the program runs, the steps of the method embodiments are performed. The foregoing storage medium includes any medium that can store program code, such as a read only memory (ROM), a random access memory (RAM), a magnetic disk, or an optical disc.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A voltage conversion circuit, comprising:
    a voltage conversion subcircuit comprising a power transistor, a first energy storage element coupled to the power transistor, and a second energy storage element coupled to the power transistor and the first energy storage element, and wherein the voltage conversion subcircuit is configured to control conduction or cutoff of the power transistor to control the first energy storage element and the second energy storage element to receive and store energy of a first direct current voltage in order to output a second direct current voltage at a coupling end of the first energy storage element and the second energy storage element; and
    a feedback loop, comprising:
        a sampling and amplification circuit;
        a feedback circuit; and
        a comparator circuit coupled to the sampling and amplification circuit and the feedback circuit,
        wherein the sampling and amplification circuit is coupled to the coupling end and is configured to:
            sample the second direct current voltage to obtain a sampling signal; and
            input the sampling signal to the comparator circuit,
        wherein the feedback circuit is coupled to the coupling end and is configured to:
            sample the second direct current voltage to obtain a sample second direct current voltage;
            combine the sampled second direct current voltage and a frequency-controllable triangular wave signal into a frequency-controllable feedback ripple signal; and
            input the frequency-controllable feedback ripple signal to the comparator circuit,
        wherein the comparator circuit is configured to:
            compare the sampling signal with the frequency-controllable feedback ripple signal; and
            output a frequency-controllable pulse width modulated (PWM) signal,
        wherein the frequency-controllable PWM signal controls the conduction or the cutoff of the power transistor, and
        wherein a frequency of the frequency-controllable PWM signal is the same as a frequency of the frequency-controllable feedback ripple signal.

2. The voltage conversion circuit according to claim 1, wherein the feedback circuit comprises a triangular wave signal generator, a frequency control subcircuit coupled to the triangular wave signal generator, and a direct current control subcircuit coupled to the frequency control subcircuit, wherein the triangular wave signal generator is configured to generate the frequency-controllable triangular wave signal, wherein the frequency control subcircuit is configured to enable the frequency of the frequency-controllable feedback ripple signal to be the same as a frequency of the frequency-controllable triangular wave signal, and wherein the direct current control subcircuit is configured to control a direct current component voltage of the frequency-controllable feedback ripple signal according to the second direct current voltage and a direct current component of the frequency-controllable triangular wave signal.

3. The voltage conversion circuit according to claim 2, wherein the frequency control subcircuit comprises a first capacitor and a second capacitor, wherein the direct current control subcircuit comprises a first resistor and a second resistor, wherein the triangular wave signal generator is coupled to the comparator circuit using the first capacitor, wherein the second capacitor is coupled between the comparator circuit and the coupling end of the first energy storage element and the second energy storage element, wherein the first resistor is coupled between the comparator circuit and the coupling end of the first energy storage element and the second energy storage element, and wherein the second resistor is coupled between the comparator circuit and a ground terminal.

4. The voltage conversion circuit according to claim 1, wherein the sampling and amplification circuit comprises a bleeder sampling circuit and an error amplification circuit coupled to the bleeder sampling circuit, and wherein the bleeder sampling circuit is configured to:

perform bleeder sampling on the second direct current voltage to obtain a bleeder sampling signal; and
input the bleeder sampling signal to the error amplification circuit, and
wherein the error amplification circuit is configured to:
compare the bleeder sampling signal with a preset reference voltage signal;
amplify a difference signal of the bleeder sampling signal and the preset reference voltage signal to obtain the sampling signal; and
input the sampling signal to the comparator circuit.

5. The voltage conversion circuit according to claim 4, wherein the bleeder sampling circuit comprises a third resistor and a fourth resistor, wherein the third resistor is coupled between the error amplification circuit and the coupling end of the first energy storage element and the second energy storage element, and wherein the fourth resistor is coupled between the error amplification circuit and a ground terminal.

6. The voltage conversion circuit according to claim 1, wherein the feedback loop further comprises a logic circuit and a drive circuit, wherein an output end of the comparator circuit is coupled to the power transistor by successively using the logic circuit and the drive circuit, wherein the logic circuit is configured to compare the frequency-controllable PWM signal with a preset control logic signal to obtain a control signal using which the conduction and the cutoff of the power transistor are controlled, and wherein the drive circuit is configured to:
convert the control signal into a drive signal that has a current driving capability; and
set the drive signal to control the conduction and the cutoff of the power transistor.

7. The voltage conversion circuit according to claim 1, wherein the power transistor comprises a first power transistor and a second power transistor, wherein the second power transistor is cut off when the first power transistor is conducted, wherein the second power transistor is conducted when the first power transistor is cut off, wherein the first energy storage element and the second energy storage element are coupled to the first power transistor and the second power transistor, wherein the first direct current voltage is configured to charge the second energy storage element through the first energy storage element when the first power transistor is conducted and the second power transistor is cut off, and wherein the second energy storage element is configured to discharge through the first energy storage element using the second power transistor when the first power transistor is cut off and the second power transistor is conducted.

8. The voltage conversion circuit according to claim 1, wherein the power transistor comprises a first power transistor and a second power transistor, wherein the second power transistor is cut off when the first power transistor is conducted, wherein the second power transistor is conducted when the first power transistor is cut off, wherein the first energy storage element and the second energy storage element are coupled to the first power transistor and the second power transistor, wherein when the first power transistor is conducted and the second power transistor is cut off, the first direct current voltage is configured to store energy using the first energy storage element, and the second energy storage element is configured to discharge, and wherein when the first power transistor is cut off and the second power transistor is conducted, the first energy storage element is configured to release energy using the second power transistor, and the first energy storage element and the first direct current voltage are configured to charge the second energy storage element.

9. The voltage conversion circuit according to claim 1, wherein the power transistor comprises a first power transistor, a second power transistor, a third power transistor, and a fourth power transistor, wherein the second power transistor is cut off when the first power transistor is conducted, wherein the second power transistor is conducted when the first power transistor is cut off, wherein the fourth power transistor is cut off when the third power transistor is conducted, wherein the fourth power transistor is conducted when the third power transistor is cut off, wherein the first energy storage element and the second energy storage element are coupled to the third power transistor and the fourth power transistor, wherein the first energy storage element is further coupled to the first power transistor and the second power transistor, wherein when the first power transistor is conducted and the second power transistor is cut off, the first direct current voltage is configured to store energy using the first energy storage element, and the second energy storage element is configured to discharge when the third power transistor is conducted and the fourth power transistor is cut off, and the first energy storage element is configured to release energy using the fourth power transistor, and the first energy storage element and the first direct current voltage are configured to charge the second energy storage element when the third power transistor is cut off and the fourth power transistor is conducted, and wherein when the third power transistor is cut off and the fourth power transistor is conducted, the first direct current voltage is configured to charge the second energy storage element through the first energy storage element when the first power transistor is conducted and the second power transistor is cut off, and the second energy storage element is configured to discharge through the first energy storage element using the second power transistor when the first power transistor is cut off and the second power transistor is conducted.

10. A voltage conversion method, comprising:
controlling conduction or cutoff of a power transistor to control a first energy storage element and a second energy storage element to receive and store energy of a first direct current voltage in order to output a second direct current voltage at a coupling end of the first energy storage element and the second energy storage element;
sampling the second direct current voltage to obtain a sampling signal;
sampling the second direct current voltage to obtain a sampled second direct current voltage;
combining the sampled second direct current voltage and a frequency-controllable triangular wave signal to a frequency-controllable feedback ripple signal;
comparing the sampling signal with the frequency-controllable feedback ripple signal; and
outputting a frequency-controllable pulse width modulated (PWM) signal,
wherein the frequency-controllable PWM signal controls the conduction or the cutoff of the power transistor, and
wherein a frequency of the frequency-controllable PWM signal is the same as a frequency of the frequency-controllable feedback ripple signal.

11. The method according to claim 10, comprising:
generating the frequency-controllable triangular wave signal;

enabling the frequency of the frequency-controllable feedback ripple signal to be the same as a frequency of the frequency-controllable triangular wave signal; and controlling a direct current component voltage of the frequency-controllable feedback ripple signal according to the second direct current voltage and a direct current component of the frequency-controllable triangular wave signal.

12. The method according to claim 10, wherein sampling the second direct current voltage to obtain the sampling signal comprises:

performing bleeder sampling on the second direct current voltage to obtain a bleeder sampling signal;

comparing the bleeder sampling signal with a preset reference voltage signal; and amplifying a difference between the bleeder sampling signal and the preset reference voltage signal to obtain the sampling signal.

13. The method according to claim 10, further comprising:

comparing the frequency-controllable PWM signal with a preset control logic signal to obtain a control signal using which the conduction and the cutoff of the power transistor are controlled;

converting the control signal into a drive signal that has a current driving capability; and setting the drive signal to control the conduction and the cutoff of the power transistor.

14. The method according to claim 10, wherein the power transistor comprises a first power transistor and a second power transistor, and wherein controlling the conduction and the cutoff of the power transistor comprises:

controlling the second power transistor to be cut off when the first power transistor is conducted;

controlling the second power transistor to be conducted when the first power transistor is cut off;

charging, by the first direct current voltage, the second energy storage element through the first energy storage element when the first power transistor is conducted and the second power transistor is cut off; and discharging the second energy storage element through the first energy storage element using the second power transistor when the first power transistor is cut off and the second power transistor is conducted.

15. The method according to claim 10, wherein the power transistor comprises a first power transistor and a second power transistor, and wherein controlling the conduction and the cutoff of the power transistor comprises:

controlling the second power transistor to be cut off when the first power transistor is conducted;

controlling the second power transistor to be conducted when the first power transistor is cut off;

storing, by the first direct current voltage, energy using the first energy storage element, and discharging the second energy storage element when the first power transistor is conducted and the second power transistor is cut off; and releasing, by the first energy storage element, energy using the second power transistor, and charging the second energy storage element by the first energy storage element and the first direct current voltage when the first power transistor is cut off and the second power transistor is conducted.

16. The method according to claim 10, wherein the power transistor comprises a first power transistor, a second power transistor, a third power transistor, and a fourth power transistor, and wherein controlling the conduction and the cutoff of the power transistor comprises:

controlling the second power transistor to be cut off when the first power transistor is conducted;

controlling the second power transistor to be conducted when the first power transistor is cut off;

controlling the fourth power transistor to be cut off when the third power transistor is conducted; and controlling the fourth power transistor to be conducted when the third power transistor is cut off, wherein when the first power transistor is conducted and the second power transistor is cut off, storing, by the first direct current voltage, energy using the first energy storage element, and discharging the second energy storage element when the third power transistor is conducted and the fourth power transistor is cut off, and releasing, by the first energy storage element, energy using the fourth power transistor, and charging the second energy storage element by the first energy storage element and the first direct current voltage when the third power transistor is cut off and the fourth power transistor is conducted, and wherein when the third power transistor is cut off and the fourth power transistor is conducted, charging, by the first direct current voltage, the second energy storage element through the first energy storage element when the first power transistor is conducted and the second power transistor is cut off, and discharging the second energy storage element through the first energy storage element using the second power transistor when the first power transistor is cut off and the second power transistor is conducted.

* * * * *